United States Patent [19]

Larson et al.

[11] Patent Number: 5,193,052
[45] Date of Patent: Mar. 9, 1993

[54] FONT CARTRIDGE EXTENDER WITH SPRING HOOK LATCH

[75] Inventors: Gregory P. Larson, Moorpark; Frank Wilkinson, Chatsworth, both of Calif.

[73] Assignee: Advanced Matrix Technology, Inc., Camarillo, Calif.

[21] Appl. No.: 788,831

[22] Filed: Nov. 7, 1991

[51] Int. Cl.⁵ .................... H05K 1/14; H05K 7/12; H01R 13/62
[52] U.S. Cl. .................... 361/395; 403/329; 400/692; 273/148 B
[58] Field of Search .................... 403/326, 329, 330; 400/121, 692; 24/295, 616; 361/390, 391, 395, 399; 273/148 B, 435; 360/94; 369/291, 292; 235/441, 492; 439/351, 357, 358, 638; 346/160

[56] References Cited

U.S. PATENT DOCUMENTS

| | | | |
|---|---|---|---|
| 686,271 | 11/1901 | Dillenbeck et al. | 292/87 |
| 2,565,636 | 8/1951 | Tinnerman | 292/80 X |
| 3,556,572 | 1/1971 | Olsson | 292/87 |
| 3,662,123 | 5/1972 | Huber | 360/94 |
| 3,947,932 | 4/1976 | Flynn | 24/616 |
| 4,068,872 | 1/1978 | Smith | 292/87 |
| 4,113,217 | 9/1978 | O'Connell | 292/87 X |
| 4,402,118 | 9/1983 | Benedetti | 24/295 X |
| 4,480,835 | 11/1984 | Williams | 273/143 B |
| 4,660,999 | 4/1987 | Tsuneki | |
| 4,683,622 | 8/1987 | Oehlke | 24/295 X |
| 4,688,121 | 8/1987 | Castagna | 360/94 |
| 4,745,667 | 5/1988 | Conte | 24/616 X |
| 4,826,332 | 5/1989 | Ukai | |
| 4,844,465 | 7/1989 | Hibino et al. | 273/143 B |
| 4,908,637 | 3/1990 | Chung | |
| 5,112,051 | 5/1992 | Darling et al. | 273/143 B |

FOREIGN PATENT DOCUMENTS

| | | | |
|---|---|---|---|
| 64775 | 8/1946 | Denmark | 292/87 |
| 3927813 | 8/1990 | Fed. Rep. of Germany | 292/80 |

*Primary Examiner*—Leo P. Picard
*Assistant Examiner*—Michael W. Phillips
*Attorney, Agent, or Firm*—Merchant, Gould, Smith, Edell, Welter & Schmidt

[57] ABSTRACT

A font cartridge extender into which a commerically available font cartridge can be plugged and which plugs into the font cartridge receptacle of a computer printer. The extender includes a novel latching mechnism which attaches the font cartridge to the extender so that the assembly can be conveniently plugged into, and unplugged from, the printer as a unit. The font cartridge is secured to the extender by a spring hook mechanism, which resides in a chute molded into the inside of the top portion of the casing of the extender. The spring hook mechanism is supported in the chute by braces and a pin molded inside the case which is inserted through an aperture in the spring hook mechanism. The spring hook mechanism is actuated by finger pressure on a contact surface.

20 Claims, 4 Drawing Sheets

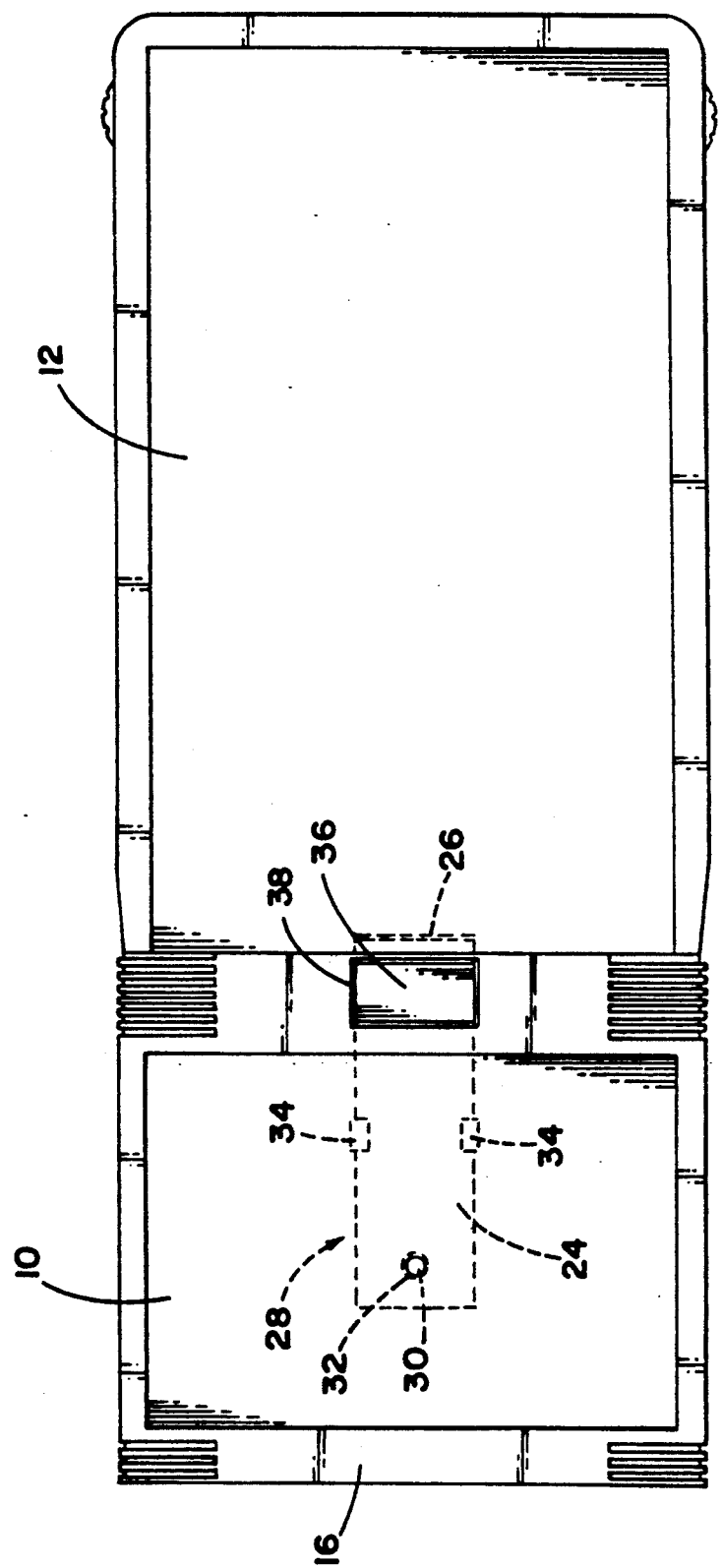

FONT CARTRIDGE EXTENDER WITH SPRING HOOK LATCH

BACKGROUND OF THE INVENTION

1. Field of the Invention

The present invention relates in general to computer printer font cartridges, and in particular, to a spring hook latching mechanism for a font cartridge extender which allows multiple font cartridges to be chained together as one operational unit.

2. Description of Related Art

In many personal computer systems, replaceable font cartridges are commonly used with printers, wherein each font cartridge contains information corresponding to a one or more character font sets. Most printers in common use, however, have only one or at most two receptacles for plugging in the font cartridges, which severely limits the selection of font sets available at any one time. When different font sets are desired, the existing font cartridge may be removed and a different one plugged in. Since the manufacturers of font cartridges decide which combinations of font sets to put into the font cartridges, it may not be possible for a user to have the selection of font sets he or she desires available on-line and installed in the printer at any one time, irrespective of how many font cartridges are owned. Thus, there is a need in the art for expansion modules which allow more than one font cartridge to be plugged into a printer receptacle.

One version of a font cartridge expansion module is shown in the co-pending U.S. patent application Ser. No. 07/632,530, filed Oct. 28, 1990, by Stephen Kurtin, and entitled "EXPANSION MODULE FOR COMPUTER PRINTER FONT CARTRIDGE," which is incorporated by reference herein. This patent discloses an expansion module which plugs into the font cartridge receptacle of a computer printer and into which a commercially available font cartridge can be plugged. Within the expansion module is a circuit board which has an edge connector at one end for plugging into the font cartridge receptacle of a printer, and a receptacle at the other end for receiving the edge connector of a font cartridge. The connector and receptacle within the expansion module are electrically connected so that a data bus which appears at the printer receptacle is coupled through to the font cartridge. The circuit board also contains sufficient read only memory (ROM) and other circuitry to store information about one or more character font sets, as desired. This information, as well as the information on the font cartridge plugged in to the expansion module, can be accessed by the printer through the data bus. When an expansion module with font cartridge attached is plugged into a printer receptacle, all of the font sets stored in the font cartridge and in the expansion module are available for use.

While the above-identified Kurtin reference describes the general concepts for font cartridge expansion modules, it does not provide a total solution. For example, the latching mechanism described in the Kurtin reference is not an optimal design. The Kurtin reference describes a latching mechanism wherein the font cartridge is held to the expansion module by two spring catches on the sides of the case. Each catch is actuated by a ramp or slide button which rides in a slot cut in the side of case, and is operated by finger pressure applied to serrations on the button. When the slide button is slid down so that the rounded end of the catch slides up the ramp, the opposite end of the catch is forced against the inside of the case of the font cartridge. The end of the catch is beveled so that it bites into the case slightly to securely hold the font cartridge and expansion module together. The catch, which is preferably fabricated from spring steel strip stock, has sufficient stiffness so that when in a locked position it bites into the font cartridge slightly, but not enough to break it. A pin acts as a pivot around which the catch turns and a leaf spring provides a restoring force to cause the catch to release when the slide button is retracted.

SUMMARY OF THE INVENTION

The present invention consists of a latching mechanism for a font cartridge extender into which a commercially available font cartridge can be plugged and which plugs into the font cartridge receptacle of a computer printer. The extender includes novel latching means which attaches the font cartridge to the extender. The font cartridge is secured to the extender by a spring hook mechanism, which resides in a chute molded into the inside of the top portion of the casing of the extender. The spring hook mechanism is supported in the chute by braces and a pin molded inside the case which is inserted through an aperture in the spring hook mechanism. The spring hook mechanism is actuated by finger pressure on a contact surface.

Using the novel latching means, the font cartridge and extender can be conveniently plugged into, and unplugged from, the printer as a unit. This is an important feature since for damage prevention and other reasons, the cartridge receptacle on most printers is recessed several inches, and for similar reasons the extender should be made as short as possible. Hence, when the expanded font cartridge is installed, the extender will normally be completely within the printer and in order to make removal convenient, it and the font cartridge should be one assembly.

BRIEF DESCRIPTION OF THE DRAWINGS

Referring now to the drawings in which like reference numbers represent corresponding parts throughout:

FIG. 2 shows a plan view of a preferred embodiment of the font cartridge extender, with a standard printer font cartridge plugged into it;

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
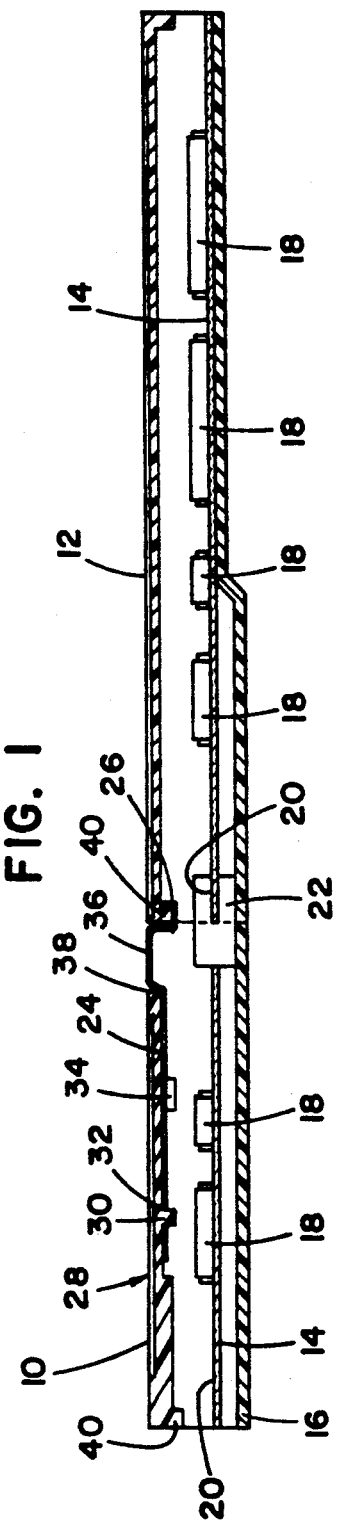
FIG. 1 is a cross-sectional side view of the preferred embodiment of a font cartridge extender with a font cartridge plugged into it.

FIG. 1 is a cross-sectional side view of the preferred embodiment of the extender 10 with a font cartridge 12 plugged into it. The extender 10 is comprised of a circuit board 14 enclosed in a protective case 16. The case 16 of the extender 10 preferably has substantially the same external cross-sectional size and shape as the font cartridge 12. The circuit board 14 includes both logic and memory devices 18, for example, a ROM device for storing character font sets and the logic required to access the ROM device in response to commands output by a printer (not shown). A data bus (not shown) between the printer and the font cartridge 12 is coupled to the font cartridge 12 through the extender 10 via a connector 20 at one end and a receptacle 22 at the other end, both of which have a plurality of contacts. Both ends of the case 16 are open to provide access to the connector 20 and receptacle 22. The configuration of the openings and the locations of the connector 20 and receptacle 22 with respect to the ends of the case 16 are such that the connector 20 can be plugged into a printer receptacle and a font cartridge 12 can be plugged into the receptacle 22. The contacts of connector 20 are electrically connected to the logic and memory circuitry on the circuit board 14 within the extender 10, which in turn is connected to corresponding contacts of the receptacle 22, so as to extend the data bus through the extender 10 to the font cartridge 12 plugged into it. Data can be retrieved by the printer from the extender 10 and font cartridge 12 combination in the same manner as if the extender 10 were not present. In an alternative mode, when the extender 10 is used by itself as a standalone font cartridge, an end cap having dimensions similar to the font cartridge 12 may be installed in place of a font cartridge to provide protection for the extender 10 and to provide a handle for installation and removal from the printer receptacle.

The font cartridge 12 (or end cap) is secured to the extender 10 by a spring hook mechanism 24, so that the assembly can be unplugged from a printer without separation. The spring hook mechanism 24 resides in a chute 28 molded into the inside of the top portion of the case 16. The spring hook mechanism 24 is supported in the chute 28 by braces 34 and a pin 30 molded inside the case 16 which is inserted through an aperture 32 in the spring hook mechanism 24.

The spring hook mechanism 24 is actuated by finger pressure on a contact surface 36 accessible through an aperture 38 in the case 16. The contact surface 36 is created by bending the spring hook mechanism 24, which is preferably fabricated from spring steel strip stock, so that the contact surface 36 is level with or slightly protruding from the outer surface of the case 16 through the aperture 38, thereby providing easy access for finger pressure. When the contact surface 36 is depressed, the spring hook mechanism 24 is forced downward and the hook 26 disengages from the lip 40 of the font cartridge 12. When the pressure is removed from the contact surface 36, and the spring hook mechanism 24 is positioned to engage the font cartridge 12, the spring hook mechanism 24 returns to its resting position and the hook 26 is securely engaged with the lip 40 on the font cartridge 12. The spring hook mechanism 24 has sufficient stiffness so that when the hook 26 engaged with the lip 40 on the font cartridge 12, it will maintain its position thus preventing the extender 10 and the font cartridge 12 from being pulled apart.

Note that the extender 10 also has a lip 40 on the end thereof opposite the spring hook mechanism 24. This lip 40 is provided so that multiple extenders 10 may be chained and securely fastened together using the spring hook mechanism 24 in a manner similar to that discussed above.

FIG. 2 shows a plan view of a preferred embodiment of the font cartridge extender 10, with a standard printer font cartridge 12 plugged into it. As indicated above, the case 16 of the extender 10 preferably has substantially the same external cross-sectional size and shape as the font cartridge 12. The font cartridge 12 is secured to the extender 10 by the spring hook mechanism 24, so that the assembly can be unplugged from a printer without separation. The spring hook mechanism 24 resides in the chute 28 molded into the inside of the top portion of the case 16, as indicated by the dotted lines in FIG. 2. The braces 34 and pin 30 are molded into the inside of the top portion of the case 16 to secure the spring hook mechanism in the chute 28. The pin 30 is inserted through the aperture 32 in the spring hook mechanism 24.

Figure 3A:
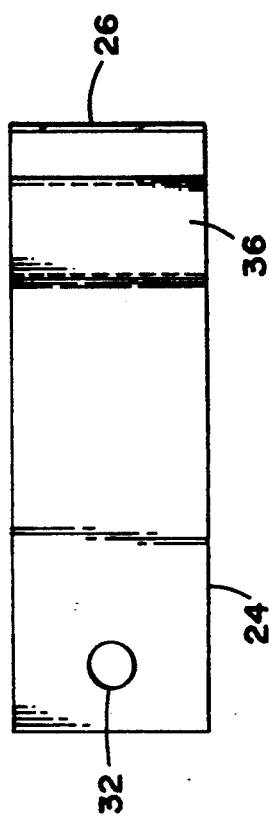
FIG. 3A is a top view and FIG. 3B is a side view of a spring hook mechanism.
Figure 3B:
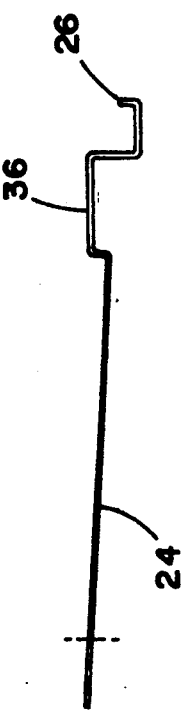

FIG. 3A is a top view and FIG. 3B is a side view of the spring hook mechanism 24. As indicated earlier, the hook 26 and the contact surface 36 are fabricated by bending the material, which preferably comprises spring steel strip stock. The contact surface 36 is created by bending the spring hook mechanism 24 so that the contact surface 36 is substantially co-planar with (or slightly protrudes from) the outer surface of the case 16, thereby providing easy access for finger pressure. The spring hook mechanism 24 also contains an aperture 32 so that the pin 32 may be used to secure and attach the spring hook mechanism 24 to the case 16 of the extender 10.

Figure 4A:
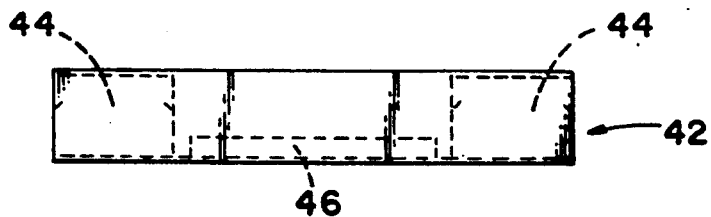
FIG. 4A is a top view of a spring clip.
Figure 4B:
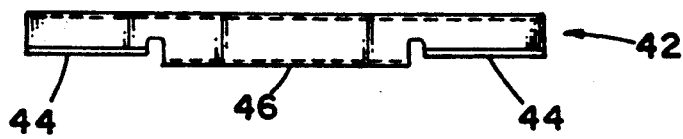
FIG. 4B is a front view of the spring clip.
Figure 4C:
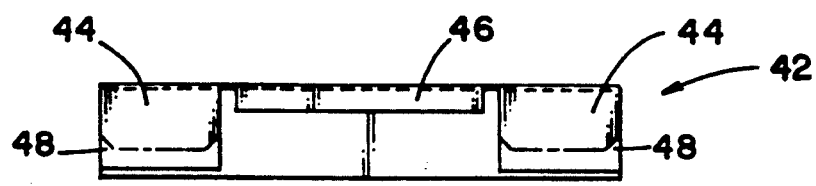
FIG. 4C is a bottom view of the spring clip.
Figure 4D:
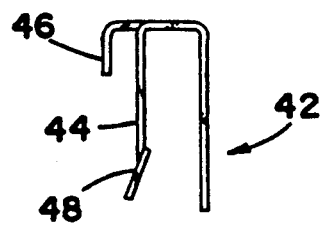
FIG. 4D is a side view of the spring clip.

FIG. 4A is a top view of a spring clip 42, FIG. 4B is a front view of the spring clip 42, FIG. 4C is a bottom view of the spring clip 42, and FIG. 4D is a side view of the spring clip 42. The spring clip 42 is used for those situations where the font cartridge 12 does not have a lip 40 for engagement with the spring hook mechanism 24. Although most contemporary Hewlett-Packard font cartridge 12 come with a lip 40 that works with the spring hook mechanism 24 for connecting to the extender 10, some of the older HP font cartridges 12, as well as some "clone" model font cartridges 12, do not have such a lip 40. Thus, to ensure continuity, a spring clip 42 is provided to create a "lip" 46 on the font cartridges 12 that lack the lip 40. Clips 44 on the spring clip 42 securely grasp the edge of the font cartridge 12. In addition, the clips 44 each have a barb 48 thereon for digging into or gouging the case 16 of the font cartridge 12 to better secure the spring clip 42 thereto.

Figure 5:
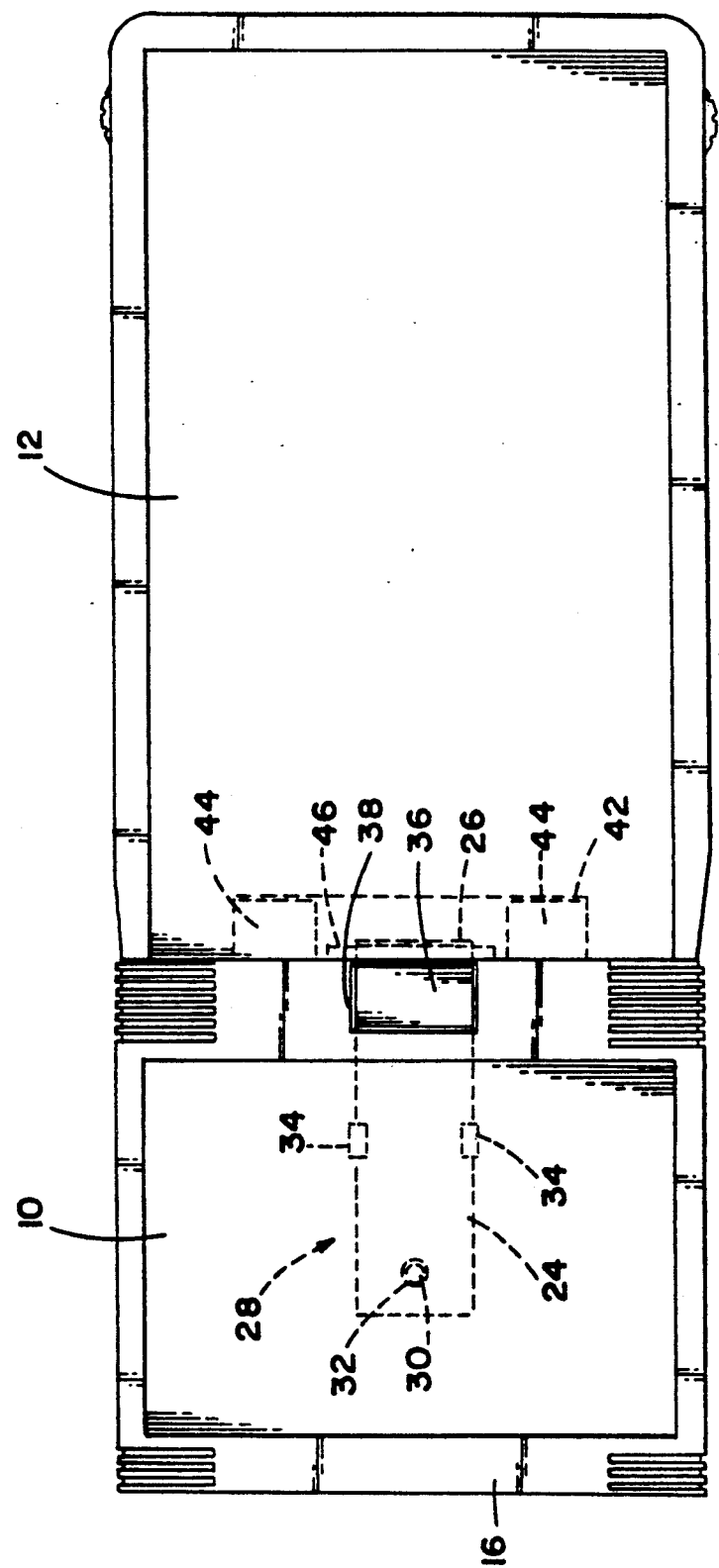
FIG. 5 is a top view, partially broken away, illustrating the use of the spring clip on a font cartridge and its engagement by the spring hook mechanism.

FIG. 5 is a top view, partially broken away, illustrating the use of the spring clip 40 on a font cartridge 12 and its engagement by the spring hook mechanism.

This concludes the description of the preferred embodiment of the invention. In summary, a font cartridge extender has been described into which a commercially available font cartridge can be plugged and which plugs into the font cartridge receptacle of a computer printer. The extender includes novel latching means which attaches the font cartridge to the extender. The font cartridge is secured to the extender by a spring hook mechanism, which resides in a chute molded into the inside of the top portion of the case of the extender. The spring hook mechanism is supported in the chute by braces and a pin molded inside the case which is inserted through an aperture in the spring hook mechanism. The spring hook mechanism is actuated by finger pressure on a contact surface.

Using the novel latching means, the font cartridge and extender can be conveniently plugged into, and unplugged from, the printer as a unit. This is an important feature since for damage prevention and other reasons, the cartridge receptacle on most printers is recessed several inches, and for similar reasons the extender should be made as short as possible. Hence, when the expanded font cartridge is installed, the extender will normally be completely within the printer and in order to make removal convenient, it and the font cartridge should be one assembly.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A latching mechanism for securing a font cartridge extender to a printer font cartridge, comprising:
   (a) a font cartridge extender adapted for coupling to a printer font cartridge, the extender comprising a circuit board enclosed in a protective case for connecting a data bus between a printer, the font cartridge extender, and the font cartridge;
   (b) a chute in the case;
   (c) a spring hook residing in the chute for engaging a lip on the font cartridge; and
   (d) braces for guiding the spring hook within the chute.

2. A latching mechanism as recited in claim 1, wherein the spring hook further comprises a contact surface for actuating the spring hook.

3. A latching mechanism as recited in claim 2, wherein when the contact surface is depressed, the spring hook is forced downward so that it disengages from the lip of the font cartridge.

4. A latching mechanism as recited in claim 3, wherein when the pressure is removed from the contact surface, and the spring hook is positioned to engage the font cartridge, the spring hook returns to a resting position so that the spring hook is securely engaged with the lip on the font cartridge.

5. A latching mechanism as recited in claim 4, wherein the spring hook has sufficient stiffness so that when it is engaged with the lip on the font cartridge, it will maintain its position thus preventing the extender and the font cartridge from being pulled apart.

6. A latching mechanism as recited in claim 1, further comprising:
   an aperture through the spring hook; and
   a pin extending through the aperture in the spring hook, thereby supporting the spring hook in the chute.

7. A font cartridge extender for a computer printer, comprising:
   (a) a case;
   (b) a circuit board within the case, the circuit board having memory for storing character font sets, logic for controlling access to the memory, an edge connector on one end for plugging into a data bus receptacle on a printer, and a receptacle on the other end for receiving the edge connector of a font cartridge, wherein the printer can access character font sets stored on either the circuit board or the font cartridge; and
   (c) latching means for securing a font cartridge to the case, the latching means comprising hook means, attached to the extender, for engaging a lip on the interior of a font cartridge case, the hook means comprising a chute in the case, a spring hook residing in the chute for engaging a lip on the font cartridge, and braces for guiding the spring hook within the chute.

8. A font cartridge extender as recited in claim 7, wherein the spring hook further comprises a contact surface for actuating the spring hook.

9. A font cartridge extender as recited in claim 8, wherein when the contact surface is depressed, the spring hook is forced downward so that it disengages from the lip of the font cartridge.

10. A font cartridge extender as recited in claim 9, wherein when the pressure is removed from the contact surface, and the spring hook is positioned to engage the font cartridge, the spring hook returns to a resting position so that the spring hook is securely engaged with the lip on the font cartridge.

11. A font cartridge extender as recited in claim 10, wherein the spring hook has sufficient stiffness so that when it is engaged with the lip on the font cartridge, it will maintain its position thus preventing the extender and the font cartridge from being pulled apart.

12. A font cartridge extender as recited in claim 8, further comprising:
   an aperture through the spring hook; and
   a pin extending through the aperture in the spring hook, thereby supporting the spring hook in the chute.

13. A latching mechanism for securing a font cartridge extender to a printer font cartridge, comprising:
   (a) a font cartridge extender adapted for coupling to a printer font cartridge, the extender comprising a circuit board enclosed in a protective case for connecting a data bus between a printer, the font cartridge extender, and the font cartridge;
   (b) a spring clip for attaching to the font cartridge and creating a lip thereon;
   (c) a chute in the case; and
   (d) a spring hook residing in the chute for engaging the lip of the spring clip on the font cartridge.

14. A latching mechanism as recited in claim 13, further comprising braces for guiding the spring hook within the chute.

15. A latching mechanism as recited in claim 13, wherein the spring hook further comprises a contact surface for actuating the spring hook.

16. A latching mechanism as recited in claim 15, wherein when the contact surface is depressed, the spring hook is forced downward so that it disengages from the lip of the font cartridge.

17. A latching mechanism as recited in claim 16, wherein when the pressure is removed from the contact surface, and the spring hook is positioned to engage the font cartridge, the spring hook returns to a resting position so that the spring hook is securely engaged with the lip on the font cartridge.

18. A latching mechanism as recited in claim 17, wherein the spring hook has sufficient stiffness so that when it is engaged with the lip on the font cartridge, it will maintain its position thus preventing the extender and the font cartridge from being pulled apart.

19. A latching mechanism as recited in claim 13, further comprising:
   an aperture through the spring hook; and
   a pin extending through the aperture in the spring hook, thereby supporting the spring hook in the chute.

20. A latching mechanism as recited in claim 13, wherein the spring clip further comprises:
   a pair of clips for securing the spring clip to the font cartridge; and
   a barb on each of the pair of clips for gouging the case of the font cartridge to further secure the clips thereto.

* * * * *

UNITED STATES PATENT AND TRADEMARK OFFICE
CERTIFICATE OF CORRECTION

PATENT NO. : 5,193,052
DATED : March 9, 1993
INVENTOR(S) : Gregory P. Larson et al.

It is certified that error appears in the above-identified patent and that said Letters Patent is hereby corrected as shown below:

Title page, item [57]
Abstract, line 2, "extrender" should read
--extender--.

Title page, item [57]
Abstract, line 2, "commercially" should read
-- commercially--.

Column 4, line 43, "cartridge" should read
--cartridges--.

Signed and Sealed this

Thirtieth Day of November, 1993

Attest:

BRUCE LEHMAN

*Attesting Officer*  Commissioner of Patents and Trademarks